US012716786B2

(12) United States Patent
Yin

(10) Patent No.: US 12,716,786 B2
(45) Date of Patent: Aug. 25, 2026

(54) THERMAL DIODE SENSOR SELF-CORRECTION

(71) Applicant: Marvell Asia Pte Ltd, Singapore (SG)

(72) Inventor: Luzhong Yin, Andover, MA (US)

(73) Assignee: Marvell Asia Pte Ltd, Singapore (SG)

( * ) Notice: Subject to any disclaimer, the term of this patent is extended or adjusted under 35 U.S.C. 154(b) by 1061 days.

(21) Appl. No.: 17/586,487

(22) Filed: Jan. 27, 2022

(65) Prior Publication Data

US 2022/0236117 A1 Jul. 28, 2022

Related U.S. Application Data

(60) Provisional application No. 63/143,001, filed on Jan. 28, 2021.

(51) Int. Cl.

| | |
|---|---|
| ***G01K 7/24*** | (2006.01) |
| ***G01K 3/00*** | (2006.01) |
| ***G01K 7/01*** | (2006.01) |
| ***G01K 15/00*** | (2006.01) |
| ***H10W 40/00*** | (2026.01) |

(52) U.S. Cl.

CPC ............... *G01K 7/24* (2013.01); *G01K 3/005* (2013.01); *G01K 7/01* (2013.01); *G01K 15/005* (2013.01); *H10W 40/00* (2026.01)

(58) Field of Classification Search

CPC .. G01K 7/00; G01K 7/01; G01K 7/24; G01K 15/00; G01K 15/002; G01K 15/005; G01K 15/007; G01K 3/005; H10W 40/00

See application file for complete search history.

(56) References Cited

U.S. PATENT DOCUMENTS

| | | | | |
|---|---|---|---|---|
| 5,961,215 | A * | 10/1999 | Lee | G01K 7/01 374/178 |
| 7,565,258 | B2 * | 7/2009 | Duarte | G01K 7/01 702/132 |
| 2007/0216468 | A1 * | 9/2007 | Duarte | G01K 7/01 702/132 |
| 2009/0296769 | A1 | 12/2009 | Fiennes et al. | |
| 2011/0116527 | A1 * | 5/2011 | Griffin | G01K 15/005 374/1 |
| 2014/0212289 | A1 | 7/2014 | Thogersen et al. | |
| 2017/0307450 | A1 | 10/2017 | Kim et al. | |

* cited by examiner

*Primary Examiner* — Randy W Gibson

(74) *Attorney, Agent, or Firm* — Hamilton, Brook, Smith & Reynolds, P.C.

(57) ABSTRACT

Temperature of a processor is monitored and managed by a control circuit. A thermal diode is positioned to indicate the temperature of the processor. A controller measures a voltage across the thermal diode and calculates a temperature of the thermal diode as a function of the voltage and a correction factor. The correction factor is a constant value that is determined based on 1) a negative correlation between the voltage and a reference temperature of the thermal diode, and 2) a positive correlation between a resistance of the thermal diode and the reference temperature. The controller causes the processor to alter an operation in response to the temperature being above a threshold.

19 Claims, 8 Drawing Sheets

THERMAL DIODE SENSOR SELF-CORRECTION

RELATED APPLICATION

This application claims the benefit of U.S. Provisional Application No. 63/143,001, filed on Jan. 28, 2021. The entire teachings of the above application are incorporated herein by reference.

BACKGROUND

Modern semiconductor fabrication techniques have continually increased the feature density and operating speed of integrated circuits, including computer processors and microcontrollers. Such developments have also resulted in increased operating temperature of those integrated circuits, requiring thermal management solutions to ensure reliable operation and longer life. Typical computer processors use an on-chip thermal diode sensor to monitor the temperature of the die on which the processor is implemented, and take appropriate action if the die temperature exceeds a threshold value.

SUMMARY

Example embodiments include a circuit comprising a thermal diode and a controller. The thermal diode may be configured to indicate temperature of a processor, and the controller may be communicatively coupled to the thermal diode. The controller may be configured to measure a voltage across the thermal diode and calculate a temperature of the thermal diode as a function of the voltage and a correction factor. The correction factor may have a constant value that is determined based on 1) a negative correlation between the voltage and a reference temperature of the thermal diode, and 2) a positive correlation between a resistance of the thermal diode and the reference temperature. The controller may further cause the processor to alter an operation in response to the temperature being above a threshold.

The thermal diode and the processor may be incorporated in a common integrated circuit. The negative correlation may be based on a measured voltage of a reference thermal diode over a given temperature range. The positive correlation may be based on a measured resistance of a reference thermal diode over a given temperature range. The controller may calculate the temperature in a manner wherein the correction factor is applied to reduce a temperature error. The controller may also calculate the temperature as a function of a product of the correction factor and a measured resistance across the thermal diode.

The resistance may be a de-embedded series resistance. The controller may cause the processor to alter the operation by at least one of reducing a clock speed of the processor, suspending an operation of the processor, and disabling the processor. The controller may be further configured to compare the temperature against a plurality of thresholds, each of the plurality of thresholds corresponding to a respective command to alter an operation of the processor. The correction factor may correspond to a minimum error value of a plurality of error values derived from respective temperature measurements.

Further embodiments include a method of managing temperature of a processor. A voltage may be measured across a thermal diode configured to indicate temperature of a processor. A temperature of the thermal diode may be calculated as a function of the voltage and a correction factor, the correction factor having a constant value that is determined based on 1) a negative correlation between the voltage and a reference temperature of the thermal diode, and 2) a positive correlation between a resistance of the thermal diode and the reference temperature. The processor may then be caused to alter an operation in response to the temperature being above a threshold.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

Typical sensor error correction methods split a sensor error into two separate parts: an error relating to an ideal diode, and an error relating to a series resistance related. Such methods correct only one of the two errors, or may correct the errors independent from one another. For the ideal diode error, ideality factor is used to make correction. Ideality factor is usually specified in the data sheet of the processor. If the ideality factor for the diode under measurement is different from the specified value, an equation may be used to calculate the error introduced at a temperature T. However, the value of the offset due to ideality factor increases with temperature. As a result, there may need to be an additional temperature dependent calibration. For the series resistance error, typical methods consider the introduced error as a constant offset with temperature.

Example embodiments, described below, may utilize the complementary dependence of diode series resistance and diode voltage on temperature. Through the derivation and use of a self-correction constant $\alpha$, complicated temperature-dependent error calibration can be avoided. Example embodiments can provide a temperature error that is significantly decreased with a nearly flat error curve. As a result, power management of a processor can be improved, and life cycle of the processor can be increased.

Figure 1:
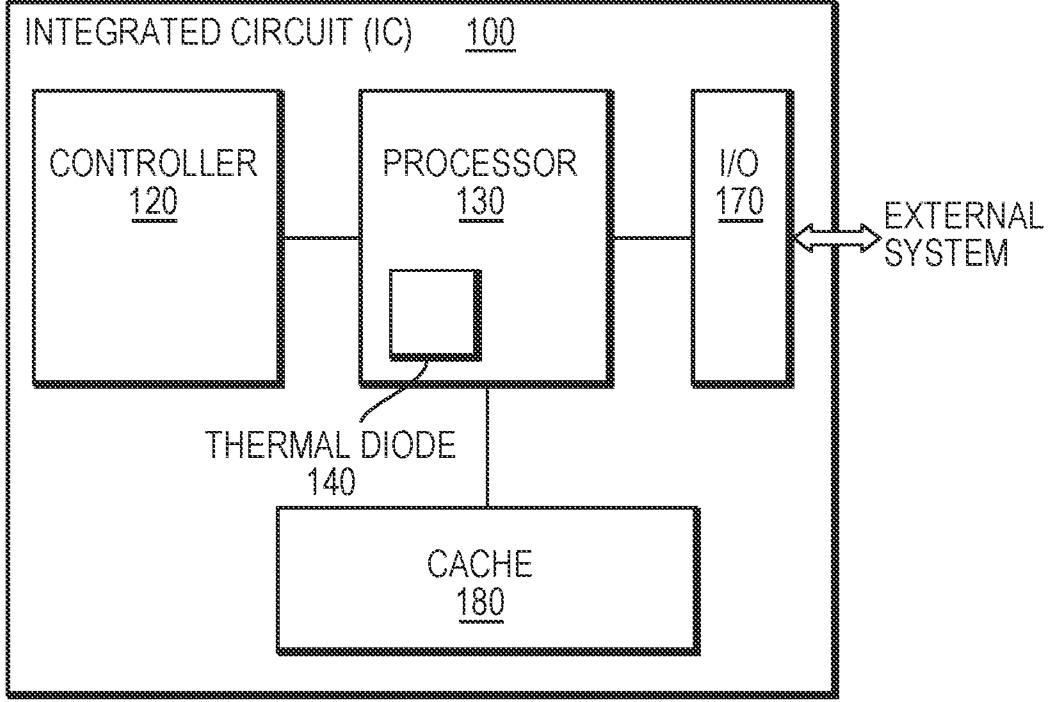
FIG. 1 is a block diagram of an integrated circuit in which example embodiments may be implemented.

FIG. 1 is a block diagram of an integrated circuit 100 in which example embodiments may be implemented. A processor 130 may be communicatively coupled to an input/output (I/O) interface 170 for communicating with an external system (not shown) to process data according to received instructions. The processor 130 may be a single processor core, or may comprise one or more discrete processor cores that may operate in parallel. A cache 180 (e.g., an L1, L2 and/or L3 cache) stores data for access by the processor 130. The integrated 100 may include several additional components as understood in the art, and are omitted here for clarity.

A controller 120 may be configured to monitor and manage one or more aspects of operation of the processor 130. For example, the controller 120 may control the operating speed of the processor 120, prioritize work and/or access requests via respective queues, and/or may enable and disable operation of the processor. To provide at least some of this management, the controller 120 may utilize the temperature of the processor 130 as indicated by a thermal diode 140. The thermal diode 140 may be located at any position that enables the thermal diode 140 to measure the temperature of the processor 130. For example, the thermal diode 140 may be integral to the processor 130 (e.g., an element of the processor 130), or may be located adjacent to the processor 130 or thermally coupled to the processor 130 via a heat-conducting element (e.g., a heatsink). The thermal diode 140 may exhibit a voltage across the diode as a function of its temperature, and the controller 120 may read this voltage in a process (described below) to determine the temperature of the thermal diode 140 and, thus, the processor 130. The controller 120 may then compare the measured temperature against a threshold. If the temperature exceeds a threshold, the controller 120 may determine that the processor 130 is overheated, and may take one or more actions to reduce the temperature of the processor 130. For example, the controller 120 may cause the processor 130 to reduce its operating speed (e.g., clock speed), temporarily disable the processor 130 to prevent damage to the processor 130, or may cause the processor 130 to reduce its operation voltage. Once the temperature falls below the same or another threshold, the controller 120 may then reverse the safety measures to enable the processor 130 to resume normal operations.

A typical thermal diode sensor has an accuracy of ±3° C. over a range of 0° C.-125° C. For a typical 50 W processor with thermal resistance 0.1 C/W, junction temperature increment from the lid is about 5° C. It would be advantageous to improve the accuracy of the temperature sensors in order to reliably report and control the temperature of the processor.

Figure 2:
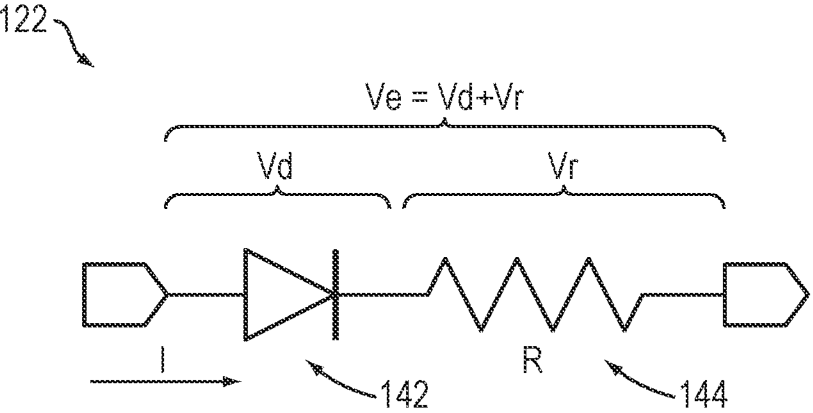
FIG. 2 is a circuit diagram of a thermal diode in one embodiment.

FIG. 2 is a circuit diagram of the thermal diode 122 in further detail. The diode 122 can be de-embedded into a series resistance 144 and ideal diode 142, each of which may introduce an error to the output of the thermal diode 122 and, thus, the measured temperature. Example embodiments can utilize a self-correction process to increase the accuracy of the measured temperature. In one embodiment, the self-correction process may utilize the following equation, with reference to FIG. 2:

$$V_d + \alpha IR = V_e + (\alpha - 1)IR \tag{1}$$

Here, $V_d$ is the voltage over the ideal diode 142, R is the series resistance 144, Ve is the voltage at the emitter, and α is a constant resistance correction factor. When α=1, the temperature measurement is uncorrected (e.g., temperature is determined by $V_e$), while α>1 is equivalent to increasing the series resistance.

Example embodiments can compensate for the correlation between the voltage and a reference temperature of the thermal diode, as well as correlation between a resistance of the thermal diode and the reference temperature, thereby reducing the error of the temperature measured from the thermal diode. The aforementioned correlations can be observed in FIGS. 3 and 4, described in further detail below.

Figure 3:
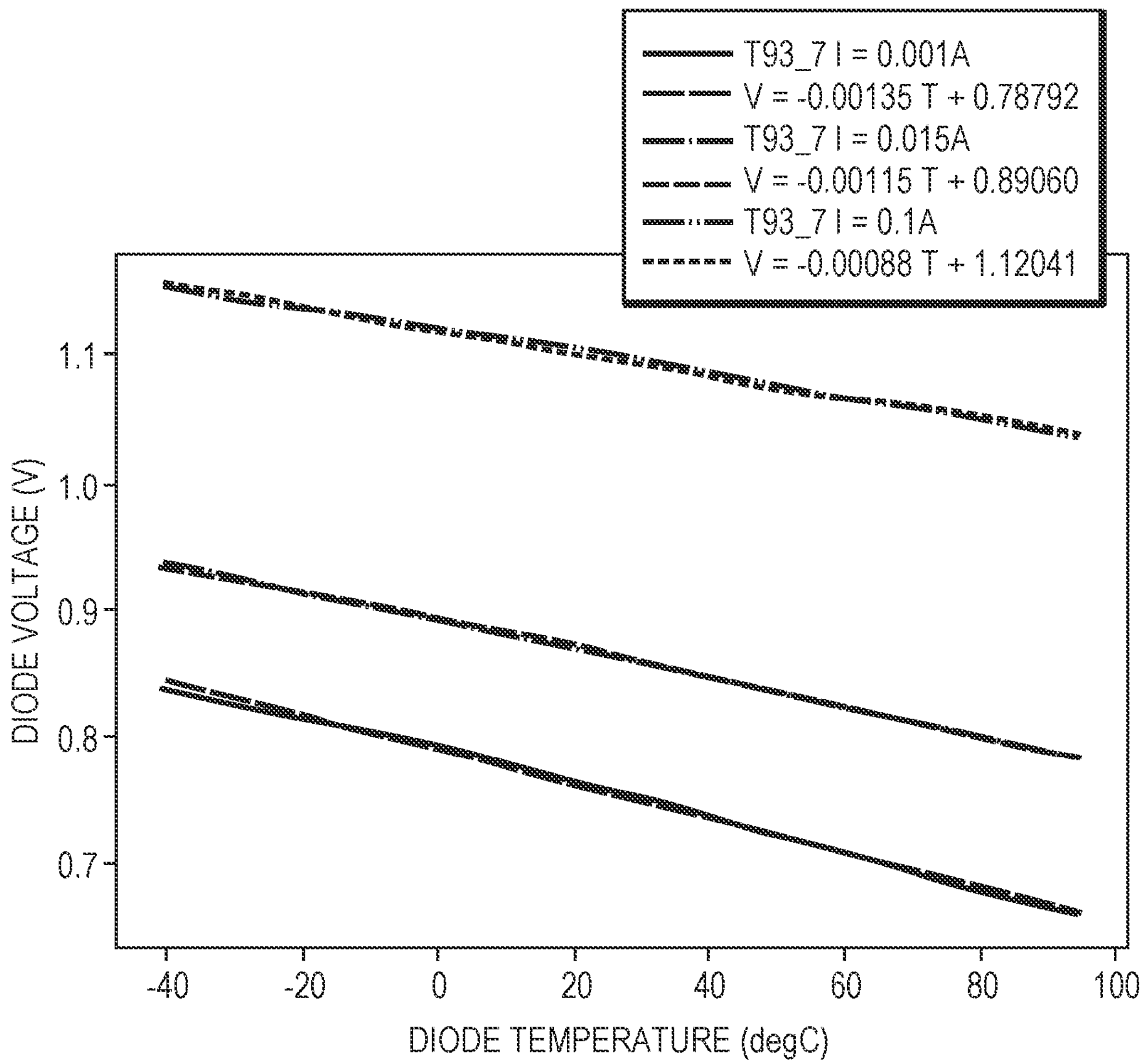
FIG. 3 is a graph of thermal diode voltage as a function of temperature in one embodiment.

FIG. 3 illustrates the voltage of three example thermal diodes as a function of diode temperature. As can be seen, diode voltage $V_e$ decreases as temperature increases, thereby exhibiting a negative correlation.

Figure 4:
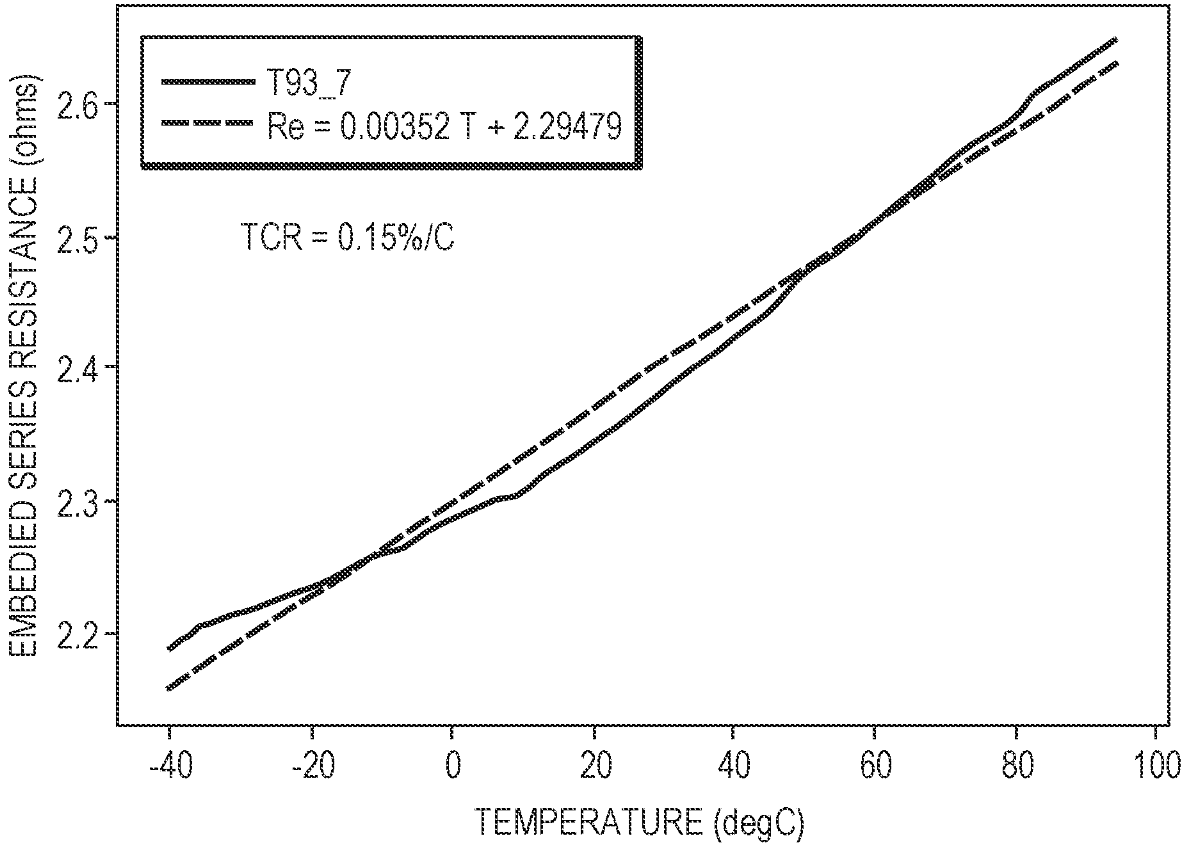
FIG. 4 is a graph illustrating de-embedded series resistance as a function of temperature in one embodiment.

FIG. 4 illustrates the de-embedded series resistance of an example thermal diode as a function of temperature. The solid line represents a measurement result, and the dotted line represents a linear fit of the measured result. As shown, the de-embedded series resistance R increases as temperature increases, thereby exhibiting a positive correlation. The de-embedded resistor temperature coefficient of resistance (TCR) is approximately 0.15%/C, which is similar to that of a discrete resistor.

Figure 5:
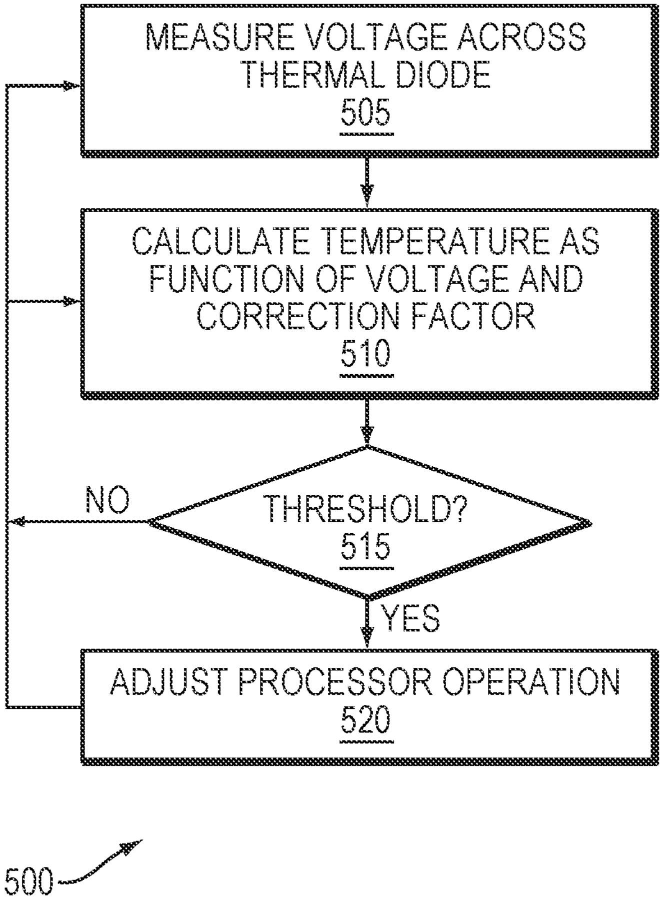
FIG. 5 is a flow diagram of a process of monitoring and managing a processor in one embodiment.

FIG. 5 is a flow diagram of a process 500 of monitoring and managing a processor in one embodiment. With reference to FIG. 1, the controller 120 may measure a voltage across the thermal diode (505). The controller 120 may then calculate a temperature of the thermal diode 140 as a function of the measured voltage and a correction factor (510). The correction factor may have a constant value that is determined based on 1) a negative correlation between the voltage and a reference temperature of the thermal diode, and 2) a positive correlation between a resistance of the thermal diode and the reference temperature. An example process for determining a correction factor is described below with reference to FIG. 6. Due to the thermal correlation between the thermal diode 140 and the processor 130 described above, the calculated temperature may indicate the temperature of the processor 130.

The controller 120 may then compare the calculated temperature against one or more thresholds (515). If the calculated temperature exceeds the one or more thresholds, the controller 120 may issue one or more commands to the processor 130 to cause the processor to alter an operation. For example, a threshold may be a predetermined maximum safe operating temperature of the processor 130, and if this threshold is exceeded, then the controller 120 may cause the processor 130 to reduce its operating clock speed by a given percentage (e.g., 50%). Further, the controller may compare the calculated temperature against multiple thresholds, each of which may correspond to a different action by the controller 120 to alter operation of the processor 130. For example, a lower temperature threshold may correspond to an action to reduce the processor's clock speed by a first percentage, a middle temperature threshold may correspond to an action to reduce the processor's clock speed by a second percentage, and a high temperature threshold may correspond to an action to suspend a given operation of the processor or disable all operation of the processor. The controller 120 may repeat the process 500 continuously or periodically during operation of the processor 130.

Figure 6:
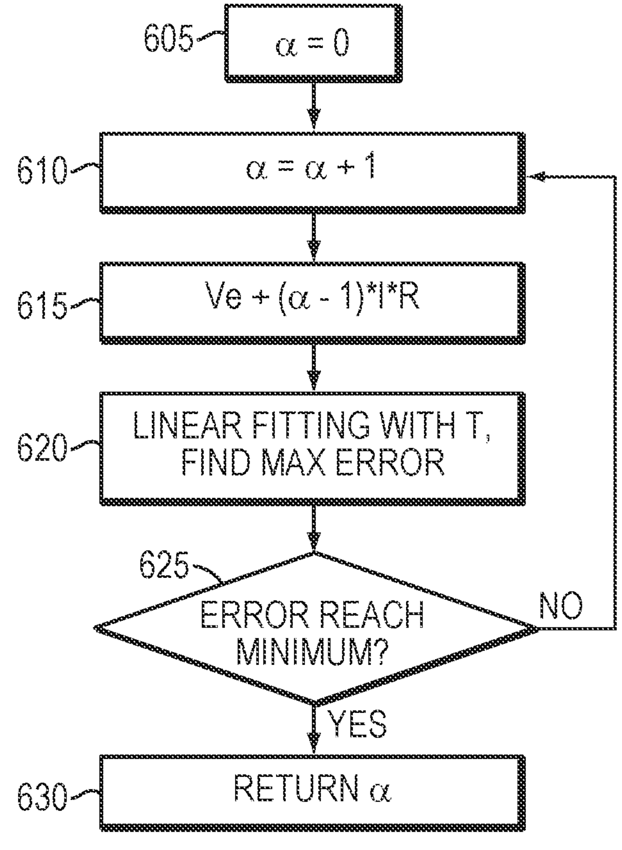
FIG. 6 is a flow diagram of a process of determining a correction factor in one embodiment.

FIG. 6 illustrates an example process 600 of determining a correction factor. A temperature of a thermal diode may be obtained as follows:

a) Set the thermal head as T0.

b) Set the chip power to a minimum value, W0.

c) Determine the diode temperature: $T=T0+\theta_{JC}*W0$, where $\theta_{Jc}$ is thermal resistance from the junction to case, and is typically approximately 0.15 C/W.

To obtain the appropriate data to determine the correction factor, a thermal diode may first be operated and measured as follows:

a) Measure the thermal diode resistance.

b) Fire two high-short current pulses I to the thermal diode, (e.g., I1=0.1 A and I2=0.09 A), and measure respective diode voltages Ve1 and Ve2. The resistance can be determined as R=(Ve2−Ve1)/(I2−I1).

c)_Using a normal reading current I (e.g., I=0.001 A), measure the diode voltage Ve.

d) Read the reference temperature T.

Either an operational thermal diode or a reference thermal diode, fabricated to comparable specifications, can be measured in this manner. After repeating the above process to obtain a range of data (Ve, R and T), the data can be used to search and determine an optimal correction factor α. First, the correction factor may be initially set to 0 (605), and then incremented by 1 (610). The incremented value a may then be inserted into the following function with values of Ve, R and T obtained above (615):

$$V_e + (\alpha - 1) * I * R \tag{2}$$

A linear regression may then be applied to find the maximum error of the function (620). Based on the linear regression, it may then be determined whether the error corresponding to the current value of the correction factor α has reached a minimum value (625). If so, then the current value of the correction factor α may be determined to be the optimal correction value, and may be output for use by the controller 120 for calculating the temperature of the thermal diode 140 according to equation (1) (630).

Figure 7:
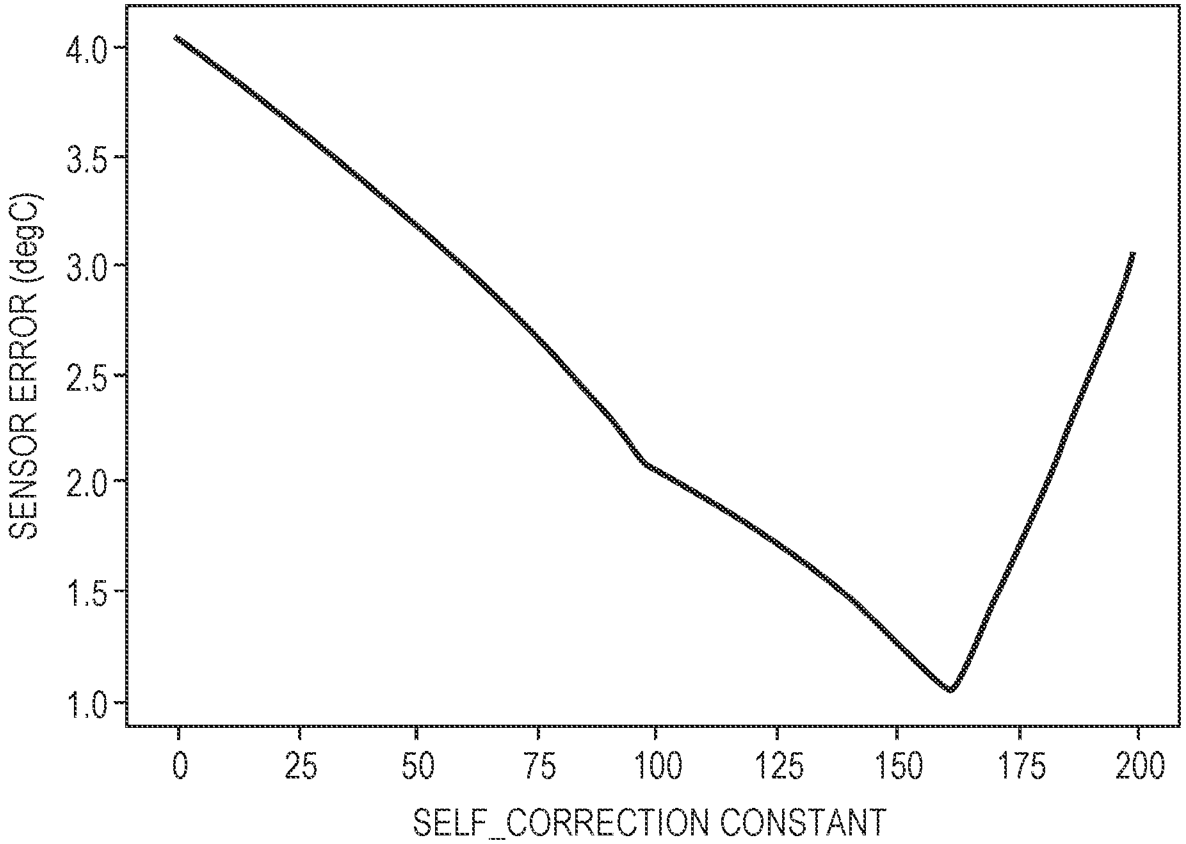
FIG. 7 is a graph illustrating sensor error as a function of a correction factor in one embodiment.

FIG. 7 is a graph illustrating sensor error as a function of the correction factor α in one embodiment. This graph may be a product of the search procedure, and in particular the linear regression, described above with reference to FIG. 6. As shown in this example, the correction factor α=161 provides the minimum error, and, thus, can be selected as the optimal correction factor for use by the controller 120.

In addition to the process described above, an alternative process may use a minimum of three temperature data points to determine the correction factor. Given the three data points (T1, T2 and T3), the following equations may be utilized:

$$a(V_{e1} + \beta V_{R1}) + b = T_1 \tag{3}$$

$$a(V_{e2} + \beta V_{R2}) + b = T_2 \tag{4}$$

$$a(V_{e3} + \beta V_{R3}) + b = T_3, \tag{5}$$

Wherein $V_R$=IR and β=α−1, and a and b are linear fitting constants. The parameters can be calculated as follows:

$$a = -\frac{-Vr1 * T3 + Vr1 * T2 - Vr3 * T2 + T3 * Vr2 + T1 * Vr3 - T1 * Vr2}{-Ve1 * Vr3 + Ve1 * Vr2 - Vr1 * Ve2 + Vr1 * Ve3 - Ve3 * Vr2 + Vr3 * Ve2} \tag{6}$$

$$\beta = -\frac{Ve2 * T3 - Ve2 * T1 + Ve3 * T1 - T3 * Ve1 + T2 * Ve1 - T2 * Ve3}{-Vr1 * T3 + Vr1 * T2 - Vr3 * T2 + T3 * Vr2 + T1 * Vr3 - T1 * Vr2} \tag{7}$$

$$b = -\frac{-Vr1 * T3 + Vr1 * T2 - Vr3 * T2 + T3 * Vr2 + T1 \times Vr3 - T1 * Vr2}{-Ve1 * Vr3 + Ve1 * Vr2 - Vr1 * Ve2 + Vr1 * Ve3 - Ve3 * Vr2 + Vr3 * Ve2}. \tag{8}$$

As an example, at I=0.001 A, sampling three temperature data points for an example thermal diode results in the following values:

a) Ve1=0.8198592 V b) Ve2=0.75890634 V c) Ve3=0.6933575V d) R1=2.21945445 Ω e) R2=2.3577152 Ω f) R3=2.5497662 Ω g) T1=−25.5232 C h) T2=24.2718 C i) T3=69.5615 C

Applying these values provide a result of β=153 and the correction factor α=154. This result is close in value to the correction factor α=161 derived in the example shown in FIG. 7 through the process 600 described above.

Figure 8A:
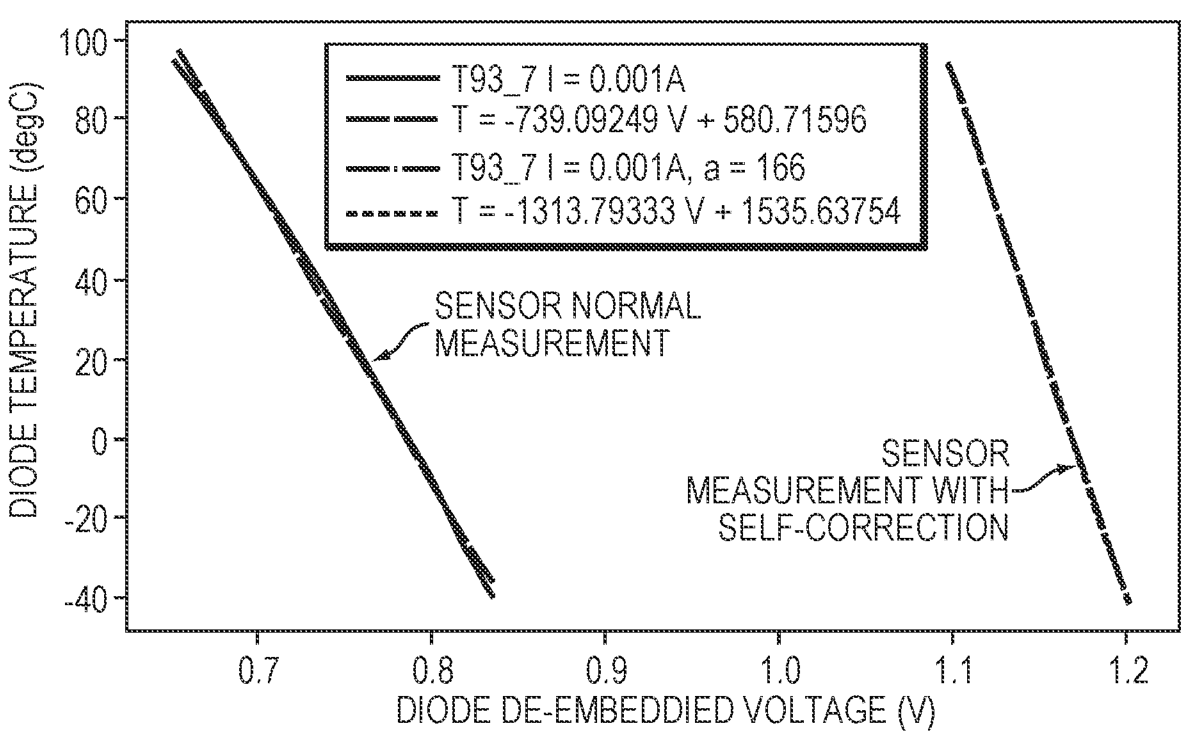
FIGS. 8A-B are graphs comparing corrected and uncorrected sensor measurements in one embodiment.
Figure 8B:
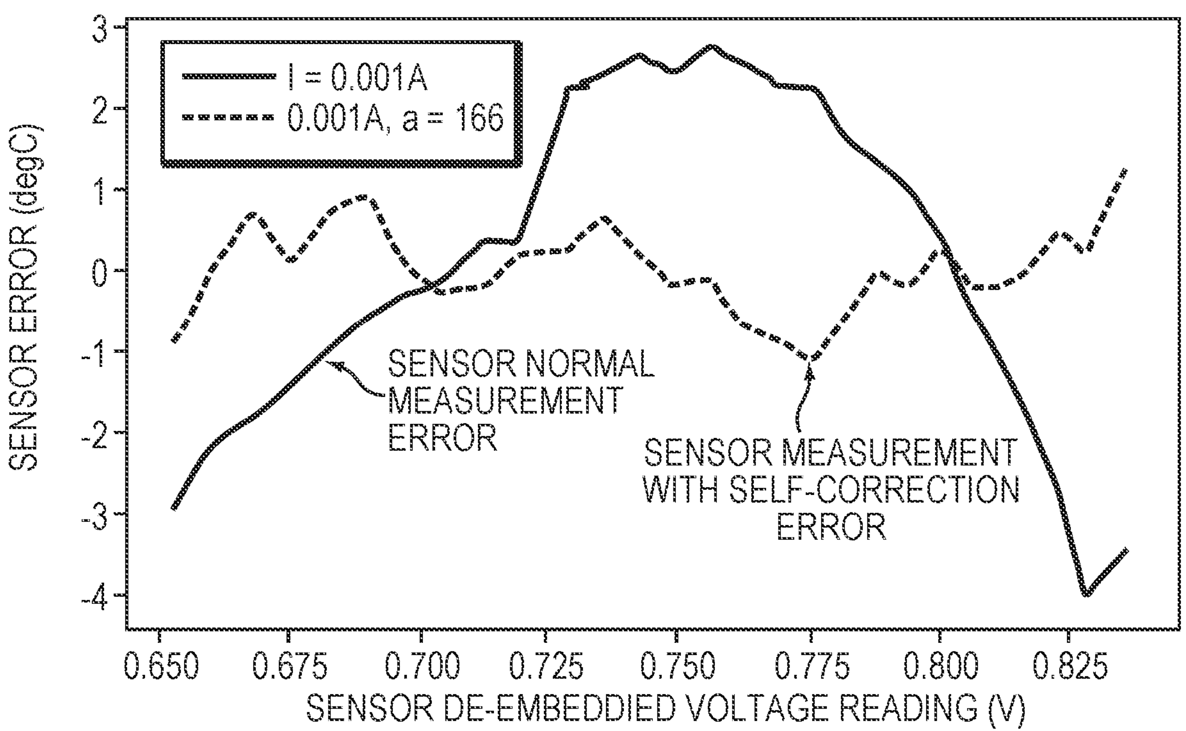

FIGS. 8A-B compare corrected and uncorrected sensor measurements in an example embodiment. FIG. 8A shows diode temperature as a function of diode de-embedded voltage V for an uncorrected measurement (left) and a corrected measurement using a correction factor α determined as described above (right). Likewise, FIG. 8B shows sensor error (° C.) as a function of the sensor de-embedded voltage V for an uncorrected measurement and a corrected measurement using the correction factor α. As shown, without correction, the sensor error is between −4 and +3° C. over a range of −40° C.~100° C., which is a typical uncorrected error. With the self-correction constant α, the sensor error becomes −1 to 1 C, a more than 60% improvement. Moreover, the error is less temperature dependent as shown in FIG. 8B.

While example embodiments have been particularly shown and described, it will be understood by those skilled in the art that various changes in form and details may be made therein without departing from the scope of the embodiments encompassed by the appended claims.

What is claimed is:

1. A circuit comprising:

a thermal diode configured to indicate temperature of a processor; and a controller communicatively coupled to the thermal diode, the controller configured to:

measure a voltage across the thermal diode;

calculate a temperature of the thermal diode as a function of the voltage and a correction factor, wherein the correction factor is a predetermined constant value stored in a computer memory that was determined based on 1) a negative correlation between the voltage and a reference temperature of the thermal diode measured over a temperature range, and 2) a positive correlation between a resistance of the thermal diode and the reference temperature measured over the same temperature range; and cause the processor to alter an operation in response to the calculated temperature being above a threshold, wherein altering the operation comprises at least one of reducing a clock speed of the processor, suspending an operation of the processor, and disabling the processor to prevent thermal damage.

2. The circuit of claim 1, wherein the thermal diode and the processor are incorporated in a common integrated circuit.

3. The circuit of claim 1, wherein the negative correlation is based on a measured voltage of a reference thermal diode over a given temperature range.

4. The circuit of claim 1, wherein the positive correlation is based on a measured resistance of a reference thermal diode over a given temperature range.

5. The circuit of claim 1, wherein the controller calculates the temperature in a manner wherein the correction factor is applied to reduce a temperature error.

6. The circuit of claim 1, wherein the controller calculates the temperature as a function of a product of the correction factor and a measured resistance across the thermal diode.

7. The circuit of claim 1, wherein the resistance is a de-embedded series resistance.

8. The circuit of claim 1, wherein the controller is further configured to compare the temperature against a plurality of thresholds, each of the plurality of thresholds corresponding to a respective command to alter an operation of the processor.

9. The circuit of claim 1, wherein the correction factor corresponds to a minimum error value of a plurality of error values derived from respective temperature measurements.

10. A computer-implemented method comprising:

automatically measuring a voltage across a thermal diode configured to indicate temperature of a processor;

automatically calculating, via a controller, a temperature of the thermal diode as a function of the voltage and a correction factor, wherein the correction factor is a predetermined constant value stored in a computer memory that was determined based on 1) a negative correlation between the voltage and a reference temperature of the thermal diode measured over a temperature range, and 2) a positive correlation between a resistance of the thermal diode and the reference temperature measured over the same temperature range; and automatically causing, via the controller generating control signals, the processor to alter an operation in response to the calculated temperature being above a threshold, wherein altering the operation comprises at least one of reducing a clock speed of the processor, suspending an operation of the processor, and disabling the processor to prevent thermal damage.

11. The method of claim 10, wherein the thermal diode and the processor are incorporated in a common integrated circuit.

12. The method of claim 10, wherein the negative correlation is based on a measured voltage of a reference thermal diode over a given temperature range.

13. The method of claim 10, wherein the positive correlation is based on a measured resistance of a reference thermal diode over a given temperature range.

14. The method of claim 10, further comprising calculating the temperature in a manner wherein the correction factor is applied to reduce a temperature error.

15. The method of claim 10, further comprising calculating the temperature as a function of a product of the correction factor and a measured resistance across the thermal diode.

16. The method of claim 10, wherein the resistance is a de-embedded series resistance.

17. The method of claim 10, further comprising comparing the temperature against a plurality of thresholds, each of the plurality of thresholds corresponding to a respective command to alter an operation of the processor.

18. The method of claim 10, wherein the correction factor corresponds to a minimum error value of a plurality of error values derived from respective temperature measurements.

19. A circuit comprising:

means for measuring a voltage across a thermal diode configured to indicate temperature of a processor;

means for calculating a temperature of the thermal diode as a function of the voltage and a correction factor, wherein the correction factor is a predetermined constant value stored in a computer memory that is was determined based on 1) a negative correlation between the voltage and a reference temperature of the thermal diode measured over a temperature range, and 2) a positive correlation between a resistance of the thermal diode and the reference temperature measured over the same temperature range; and means for causing the processor to alter an operation in response to the temperature being above a threshold, wherein altering the operation comprises at least one of reducing a clock speed of the processor, suspending an operation of the processor, and disabling the processor to prevent thermal damage.

* * * * *